US011322364B2

(12) United States Patent
Joy et al.

(10) Patent No.: US 11,322,364 B2
(45) Date of Patent: May 3, 2022

(54) METHOD OF PATTERNING A METAL FILM WITH IMPROVED SIDEWALL ROUGHNESS

(71) Applicant: Tokyo Electron Limited, Tokyo (JP)

(72) Inventors: Nicholas Joy, Albany, NY (US); Angelique Raley, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/870,121

(22) Filed: May 8, 2020

(65) Prior Publication Data

US 2021/0313192 A1 Oct. 7, 2021

Related U.S. Application Data

(60) Provisional application No. 63/003,611, filed on Apr. 1, 2020.

(51) Int. Cl.
*H01L 21/321* (2006.01)
*H01L 21/3213* (2006.01)
*H01J 37/32* (2006.01)

(52) U.S. Cl.
CPC .. *H01L 21/32136* (2013.01); *H01J 37/32449* (2013.01); *H01L 21/32139* (2013.01); *H01J 2237/334* (2013.01)

(58) Field of Classification Search
CPC ................................................ H01L 21/32136
See application file for complete search history.

(56) References Cited

U.S. PATENT DOCUMENTS

| 5,575,888 A | 11/1996 | Kosakowski et al. |
| 5,624,583 A | 4/1997 | Tokashiki et al. |
| 6,265,318 B1 | 7/2001 | Hwang et al. |
| 6,541,380 B2 | 4/2003 | Ying et al. |
| 6,730,561 B2 | 5/2004 | Hwang et al. |
| 6,784,108 B1 | 8/2004 | Donohoe et al. |
| 7,008,877 B2 | 3/2006 | Constantine et al. |
| 9,558,931 B2 | 1/2017 | Tang et al. |
| 11,049,730 B2 | 6/2021 | Nagatomo et al. |
| 2004/0195216 A1* | 10/2004 | Strang ............... H01J 37/32082 219/121.43 |
| 2004/0222185 A1* | 11/2004 | Kawai ................... H01L 43/12 216/22 |
| 2005/0051820 A1* | 3/2005 | Stojakovic ............. G11C 11/22 257/295 |
| 2013/0119018 A1* | 5/2013 | Kanarik ........... H01J 37/32165 216/67 |
| 2016/0104630 A1* | 4/2016 | Shen ................. H01L 21/32136 438/694 |
| 2019/0311915 A1* | 10/2019 | Nagatomo ............. H01L 22/26 |

FOREIGN PATENT DOCUMENTS

KR 20190116933 A 10/2019

OTHER PUBLICATIONS

Notification of Transmittal of the International Search Report and the Written Opinion of the International Searching Authority, or the Declaration, International Application No. PCT/US2021/023874, dated Jul. 14, 2021.

* cited by examiner

*Primary Examiner* — Thomas T Pham
(74) *Attorney, Agent, or Firm* — Slater Matsil, LLP

(57) ABSTRACT

In accordance with an embodiment, a method of plasma processing includes etching a refractory metal by flowing oxygen into a plasma processing chamber, intermittently flowing a passivation gas into the plasma processing chamber, and supplying power to sustain a plasma in the plasma processing chamber.

20 Claims, 14 Drawing Sheets

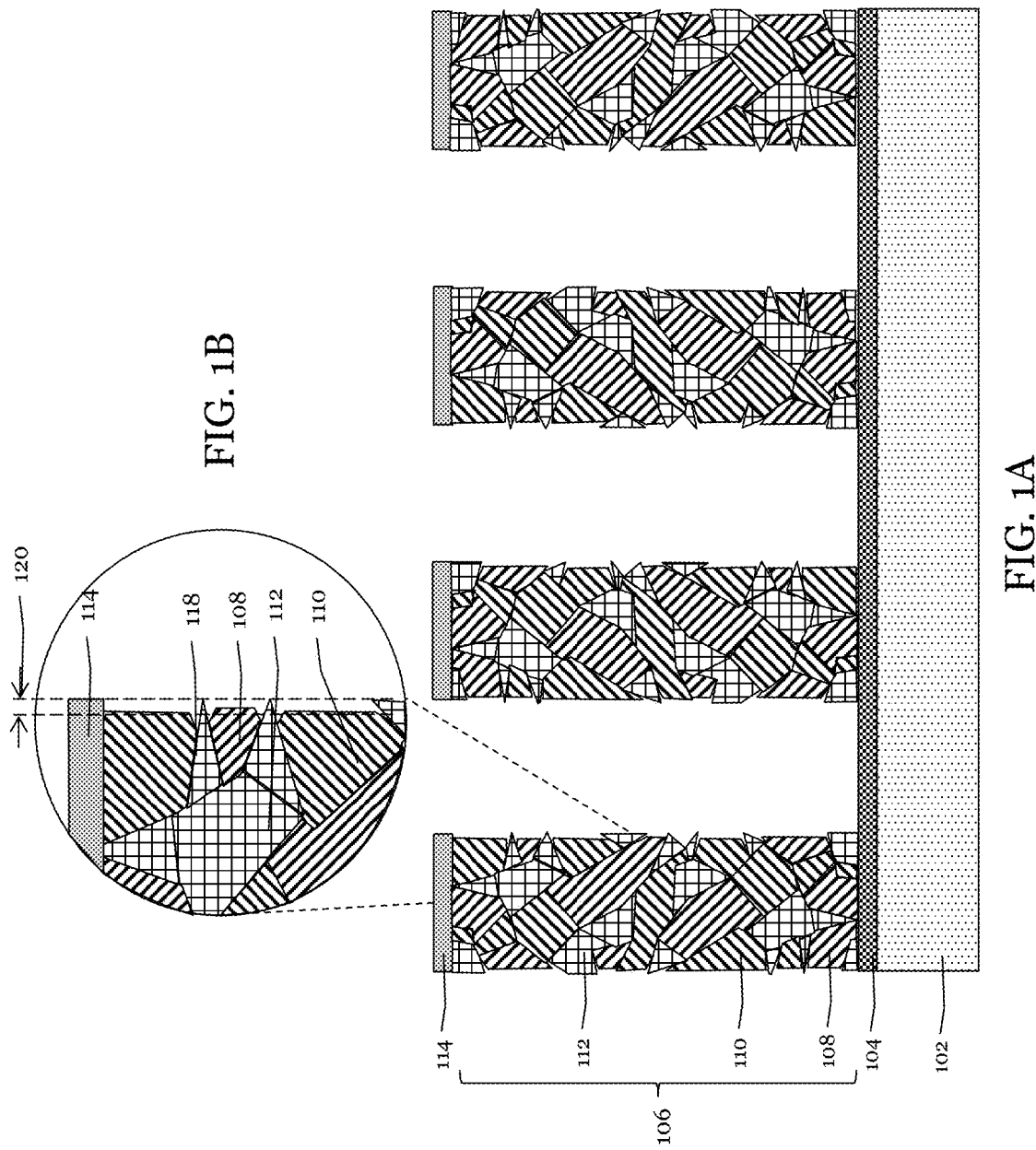

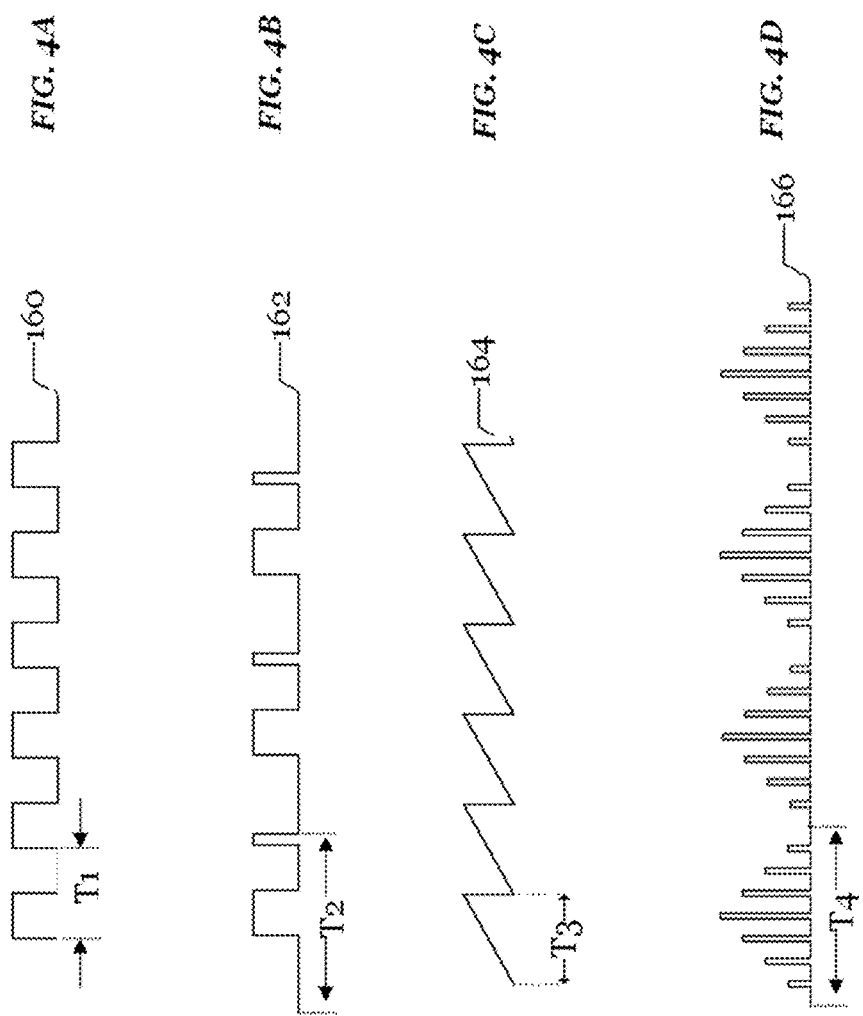

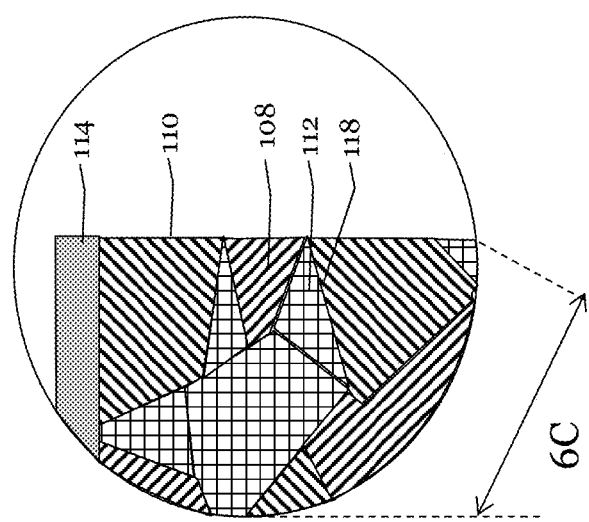

METHOD OF PATTERNING A METAL FILM WITH IMPROVED SIDEWALL ROUGHNESS

This application claims the benefit of U.S. Provisional Application 63/003,611 filed on Apr. 1, 2020, which is incorporated herein by reference.

TECHNICAL FIELD

The present invention relates generally to plasma processing, and, in particular to plasma processes for etching refractory metals.

BACKGROUND

The semiconductor integrated circuit (IC) industry, driven by a demand for doubling circuit density every two years, has periodically reduced the minimum feature sizes of transistors and interconnects. Already, the generation of ICs commonly referred to as the 10 nm node uses less than 40 nm pitch for densely packed metal lines at the lower interconnect levels, and about 50 nm pitch for contacts to transistors. At these and smaller dimensions, the interconnect-RC delay of conventional copper (Cu) lines and tungsten (W) contacts may be limiting the speed of digital circuits. New materials are being introduced at the 10 nm nodes and below to replace dense copper lines and W contacts. Refractive metals such as ruthenium (Ru), molybdenum (Mo), osmium (Os), niobium (Nb) and iridium (Ir) and alloys thereof are some of the leading candidates for replacing copper and tungsten in these and other applications.

SUMMARY

In accordance with an embodiment, a method of plasma processing includes etching a refractory metal by flowing oxygen into a plasma processing chamber, intermittently flowing a passivation gas into the plasma processing chamber, and supplying power to sustain a plasma in the plasma processing chamber.

In accordance with an embodiment, a method of plasma processing includes patterning a hard mask layer disposed over a refractory metal layer; and in a plasma processing chamber, patterning the refractory metal layer using the hard mask layer as an etch mask. The patterning of the refractory metal layer includes flowing reactant gas for etching the refractory metal layer into the plasma processing chamber, pulsing a passivation gas into the plasma processing chamber, and etching the refractory metal layer to expose an underlying layer disposed underneath the refractory metal layer.

In accordance with an embodiment, a method of plasma processing includes plasma etching a layer comprising ruthenium or molybdenum by continuously flowing a gas including chlorine into a plasma processing chamber, sustaining a plasma in a plasma processing chamber. During the plasma etching, the method includes flowing a passivation gas including sulfur into the plasma processing chamber.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B illustrate cross-sectional views of refractory metal leads etched using a plasma with oxygen, a gas including chlorine, and an inert sputtering gas;

FIGS. 2A-2B illustrate plasma etching of a refractory metal with a continuous flow of a passivant gas in accordance with an embodiment of the invention, wherein FIG. 2A illustrates a timeline of gas flows, and wherein FIG. 2B illustrates a flow diagram describing the timeline in FIG. 2A;

FIGS. 3A-3B illustrate plasma etching of a refractory metal with a passivant gas pulsed into the plasma processing chamber in accordance with an embodiment of the invention, wherein FIG. 3A illustrates a timeline of gas flows, and wherein FIG. 3B illustrates a flow diagram describing the timeline in FIG. 3A;

FIGS. 4A-4H are diagrams depicting multiple example pulse waveforms for the flow of the passivant gas in accordance with an embodiment;

FIGS. 6A-6D illustrate cross-sectional views of a method of plasma etching refractory metal leads with either a continuous flow or a pulsed flow of a passivant gas in accordance with an embodiment;

DETAILED DESCRIPTION OF ILLUSTRATIVE EMBODIMENTS

Figure 2A:
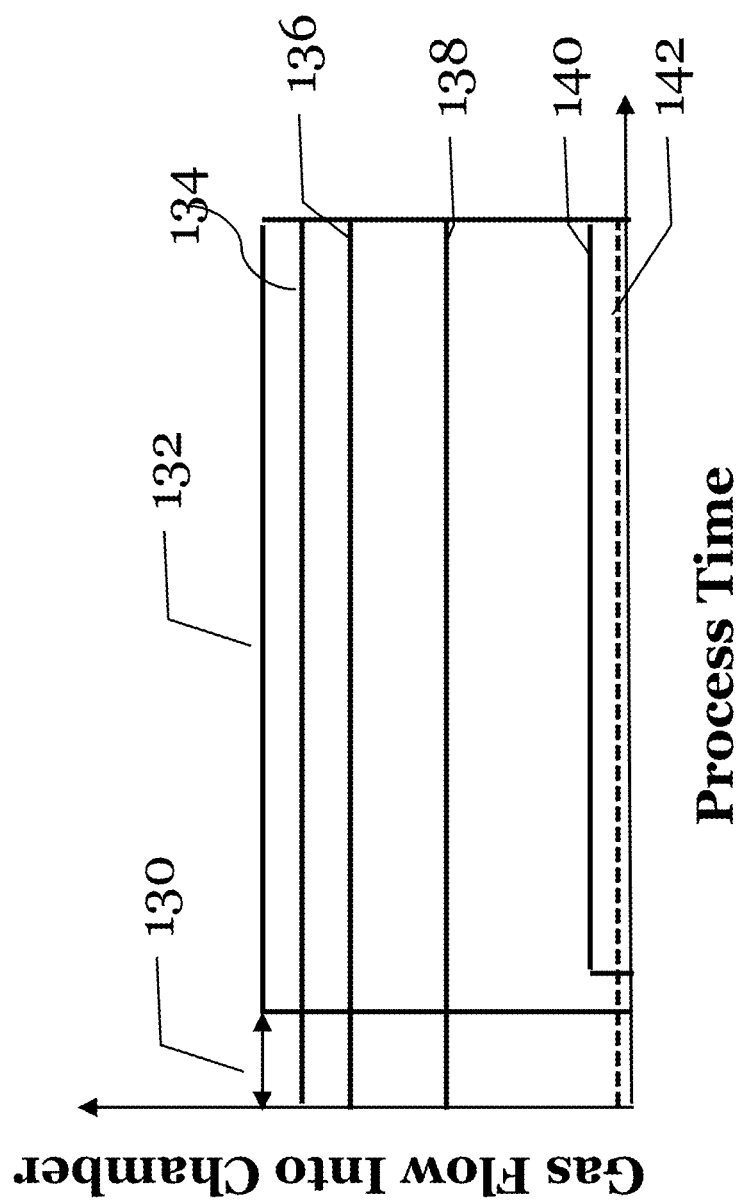

Removing refractory metals using chemical mechanical polish (CMP) is difficult and expensive. For example, the damascene process for forming leads with refractory metals such as ruthenium, molybdenum, osmium, and iridium is a difficult and expensive process in manufacturing because of the use of a CMP step. A plasma process for etching refractory metal leads is therefore desirable. For a plasma etching process to be suitable in semiconductor manufacturing, a plasma etching method for removing refractory metals is expected to provide several characteristics: high etch rate with high selectivity to adjacent materials, high etch-uniformity across a substrate, controllable anisotropy for vertical sidewall profile without stringer defects, low sidewall roughness during anisotropic etching, and smooth top-surface for etch back. Such a method is currently not available with conventional processes. This disclosure describes embodiments of methods of plasma etching thin films of conductive materials comprising refractory metals such as pure ruthenium, an alloy of ruthenium with other metals, molybdenum, niobium, pure osmium, an alloy of osmium with other metals, pure iridium, and an alloy of iridium with other metals thereof.

Refractory metals are deposited in a crystalline form. Consequently, during etching, grain boundaries and the surface of crystal grains are exposed on the sidewalls being formed. The inventors have identified that the plasma etching of certain refractory metals laterally attacks sidewalls of refractory metals in a way that is not purely isotropic.

A conventional plasma etching process will be first described using FIGS. 1A-1B. Next, a first embodiment of a plasma etching process will be described using FIGS. 2A-2B while a second embodiment of a plasma etching process will be described using FIGS. 3A-3B. A plasma system for implanting the embodiments of the plasma etching process will be described using FIG. 5. A specific method of forming refractory metal leads incorporating either the first embodiment of FIGS. 2A-2B or the second embodiment of FIGS. 3A-3B will be described using FIGS. 6A-6D along with the flow chart of FIG. 7.

Referring now to FIG. 1A, which illustrates a cross-sectional view of a semiconductor device after forming refractory metal leads using a conventional plasma etch process.

The refractory metal 106 leads are on an etch stop layer 104 that is disposed on a substrate 102. Using a hard mask pattern 114, the refractory metal 106 leads are plasma etched exposing sidewalls as illustrated in FIGS. 1A and 1B.

FIG. 1B is an expanded cross-sectional view of the sidewall of the refractory metal layer 106 after the completion of the etching process.

The inventors of this application have identified that the lateral etching rate of crystals with different orientations may be different, which may result in a sidewall surface with different amount of material being removed causing different degrees of undercut 120 (FIG. 1B) and therefore large variations in resistance in deeply scaled technologies. This is described further below in more detail with the illustration of FIG. 1B.

For illustration, refractory metal crystal grains 108, 110, and 112 with three different crystal orientations are shown. The lateral etching may thus reduce the width of the refractory metal leads resulting in increased resistance. An undercut of 2 nm per side on a 200 nm metal lead increases lead resistance by about 2%. A lead resistance increase of 2% is of little consequence. The same undercut of 2 nm per side on a 20 nm metal lead increases resistance by 20%. A lead resistance increase of 20% has a significant negative affect on circuit performance. Accelerated lateral plasma etching along grain boundaries 118 exposed on the refractory metal 106 sidewalls may additionally increase sidewall roughness and additionally increase lead resistance. In addition, the amount of undercuts is a variable depending on the grain structure. Accordingly, the presence of a varying amount of undercut can cause large variation and increase in line resistance especially in deeply scaled technologies such as in 10 nm technology node and below.

In various embodiments, the present application discloses addition of a passivant gas while plasma etching the refractory metals. The passivant gas can be a gas including sulfur or can be HBr or $SiCl_4$. Etch products of the gas may passivate the sidewalls blocking lateral etching. The resulting sidewalls may be smooth and with improved control of linewidth and profile. Reduced linewidth loss may result in lower lead resistance. Improved linewidth control may result in reduced lead-to-lead resistance variation.

Figure 2B:
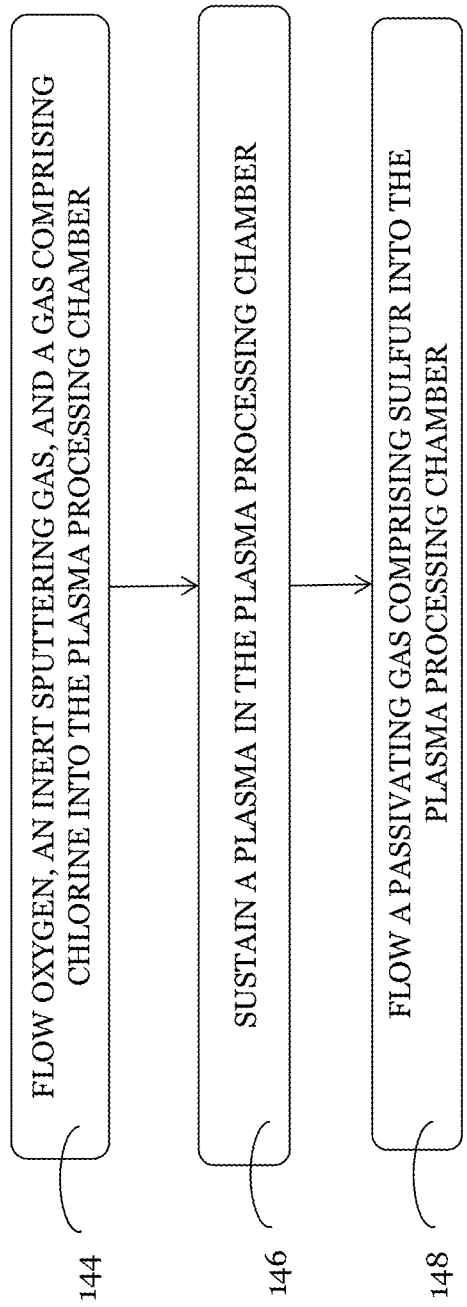

FIG. 2A is a diagram depicting gas flows into a plasma processing chamber in an example embodiment. FIG. 2B is a flow diagram describing the timeline in FIG. 2A. In this embodiment a continuous flow of a passivant gas 140 including sulfur or passivant gas HBr or $SiCl_4$ is introduced into the plasma processing chamber during the plasma etching process.

At process time zero, (step 144, FIG. 2B) the flow of a reactant gas 134 is initiated into the plasma processing chamber. For etching ruthenium and osmium, oxygen is the reactant gas 134. However, for etching other metals such as molybdenum, the reactant gas 134 may include a chlorine based chemistry although some oxygen may also be included. The flow of other etching gases such as a gas including chlorine 138 and an inert sputtering gas 136 may also be initiated to enhance the etching rate. For example, a gas including chlorine 138 may be used to oxidize non-volatile refractory metal oxides that may otherwise settle on the etch surfaces and block further etching.

After the pressure in the chamber is stabilized 130, the plasma is turned ON and sustained 132 in the plasma processing chamber (step 146, FIG. 2B) throughout the refractory metal 106 etching process. The plasma begins to etch the refractory metal 106 where exposed.

A passivant gas 140 including sulfur or passivant gas HBr or $SiCl_4$ may then be introduced into the chamber and flowed during refractory metal etching (step 148, FIG. 2B). The flow of the passivant gas 140 can be started with the flow of the other etching gases, 134, 136, and 138 or can be delayed until the sidewalls have begun to form.

The plasma etching process 132 continues until the refractory metal 106 is etched away, and the underlying etch stopping layer 104 is exposed.

The plasma with the reactant gas 134 (e.g., oxygen) etches refractory metals 106 by forming volatile metal oxide etch products. For example, an oxygen plasma etches ruthenium metal (Ru) and ruthenium dioxide ($RuO_2$) metal to form volatile ruthenium oxides, $RuO_3$ and $RuO_4$. Chlorine atoms from a gas including chlorine 138 such as $Cl_2$, $CCl_4$, $CHCl_3$, and HCl accelerate the etching by facilitating the formation of the volatile metal oxide etch products. An inert sputtering gas 136 such as argon, krypton, or xenon accelerates the removal of refractory metal atoms from the horizontal surface by sputter etching in addition to the chemical etching. The sputtered refractory metal atoms are converted to volatile oxides in the oxygen plasma.

A passivant gas 140 including sulfur forms a passivating layer on the vertical sidewalls and blocks lateral etching. The passivating layer also forms on the horizontal surface being etched, but does not stop etching in the vertical direction due to the continuous bombardment of energetic ions. Example passivant gases including sulfur may include $SO_2$, $SF_6$, SO, COS, and $H_2S$.

In an alternative arrangement, HBr may be used as the passivant gas. Bromine radicals in the plasma may react with exposed refractory metal on the sidewall surface forming a passivating layer that blocks lateral etching.

Additionally, $SiCl_4$ may be used as the passivant gas. $SiCl_4$ easily decomposes in the plasma, resulting in Si deposition and Cl radicals. A well controlled amount of $SiCl_4$ can result in a thin passivating layer that is enough to block lateral etching but not enough to stop vertical etching While some amount of the passivant gas 140 controls the passivation of the sidewalls and hence is advantageous, large amounts of the passivant gas 140 may result in a decrease in the etch rate. Lower etch rate may then result in lower etch throughput. The longer etching time can also erode the hard mask 114 causing line width loss and higher lead resistance. One way to mitigate the decrease in the etch rate is to reduce the amount of passivant gas 140 flowing into the chamber. However, the flow rate may not be reduced below a certain floor level 142 set by equipment capabilities. Even with the passivant gas 140 flow set to the floor level 142 of the mass flow controller, the etch rate may still be undesirably low and/or the sidewall passivation may still be inadequate.

Another way to control the amount of the passivant gas 140 entering the plasma processing chamber is to change the flow of the passivant gas 140 with time. For example, pulsing or intermittently flowing the passivant gas 140 effectively reduces the total amount of passivant gas 140 entering the chamber during the etching process while still providing a concentration in the plasma sufficient to form passivation during the pulses.

Figure 3A:
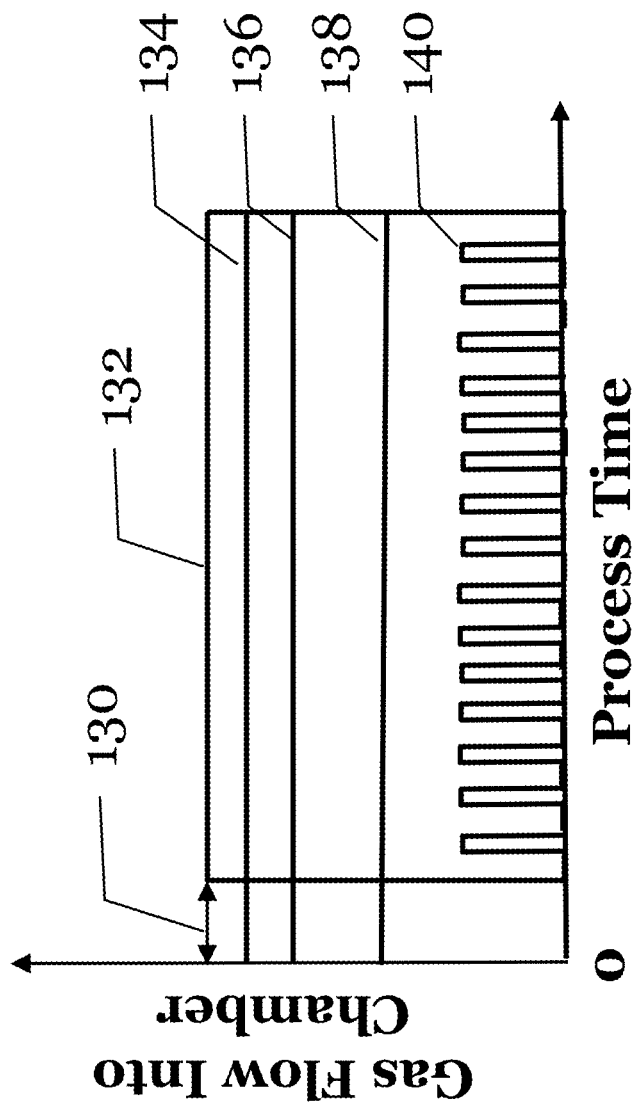
Figure 3B:
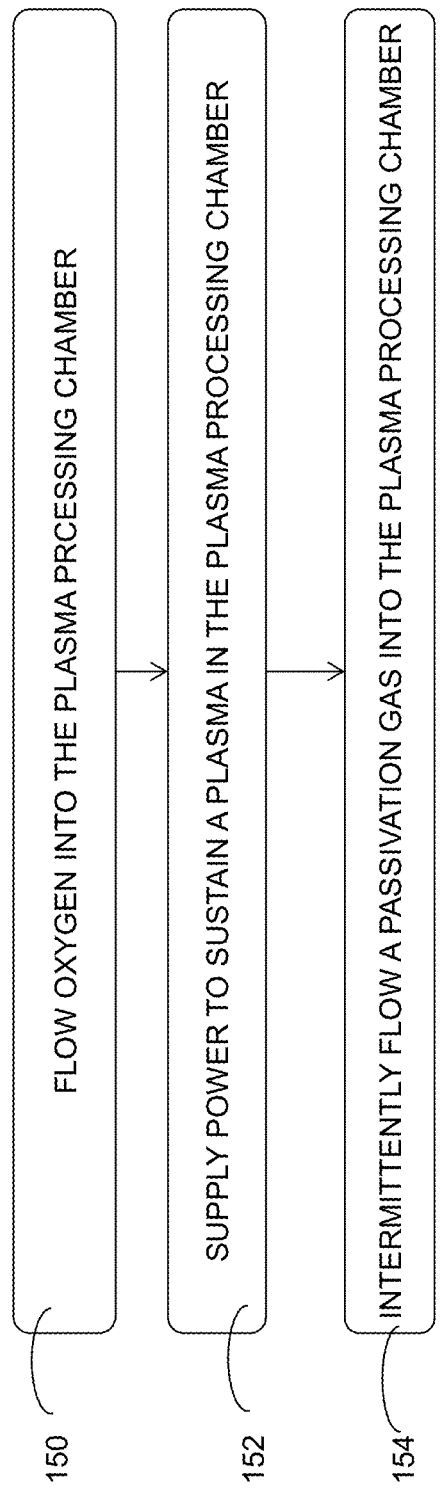

Introducing the passivant gas 140 into the plasma processing chamber by pulsing is illustrated in FIG. 3A and is described in the flow diagram in FIG. 3B.

At process time zero, a reactant gas 134 such as oxygen begins flowing into the plasma processing chamber (step 150, FIG. 3B). As previously discussed, the flow of other gases such as a gas including chlorine 138 and an inert sputtering gas 136 may also be initiated to accelerate the refractory metal etching. A gas including chlorine 138 such as $Cl_2$, $CCl_4$, $CHCl_3$, and HCl increases the etching rate by facilitating the formation of volatile metal oxides. An inert sputtering gas 136 such as argon, krypton, and xenon increases the etching rate by sputter etching the exposed horizontal surface of the refractory metal 106.

After the pressure is stabilized 130, the plasma is turned ON. After the plasma is stabilized 130, pulses of the passivation gas 140 are injected into the plasma processing chamber. In some embodiments, the pulsed flow of passivant gas 140 may be started simultaneously with the flows of the reactant gas 134, the inert sputtering gas 136, and the gas including chlorine 138. In some embodiments, the pulsed flow of passivant gas 140 may be delayed (as illustrated in FIG. 3A) until sidewalls have begun to form.

The plasma etching process 132 continues until the refractory metal 106 is etched away exposing the underlying etch stopping layer 104. Pulsing the flow of a passivant gas 140 provides sufficient passivation of the sidewalls to block lateral etching while not appreciably slowing the vertical etching.

Although the above example in FIG. 3A illustrates an apparently periodic pulsing, the passivant gas may be introduced differently to achieve an optimal relationship between the vertical sidewall and the horizontal surface being etched. In addition, although the example above illustrates a vertical sidewall orthogonal to the horizontal surface being etched, in other embodiments, a slanted sidewall may be desired and may be obtained by modulating the passivant gas.

Figure 4E:
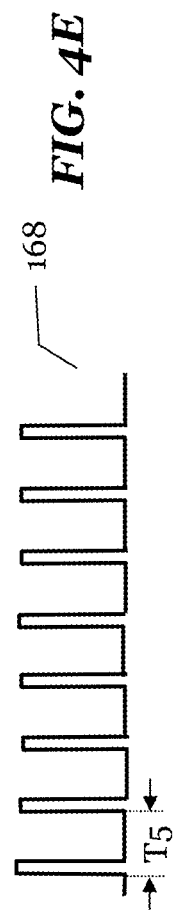
Figure 4F:
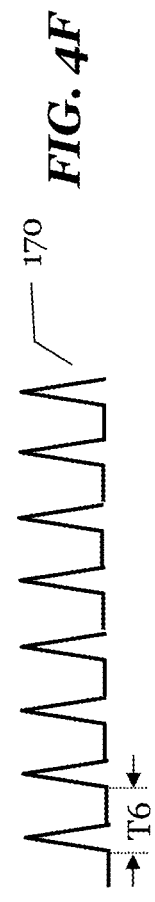
Figure 4G:
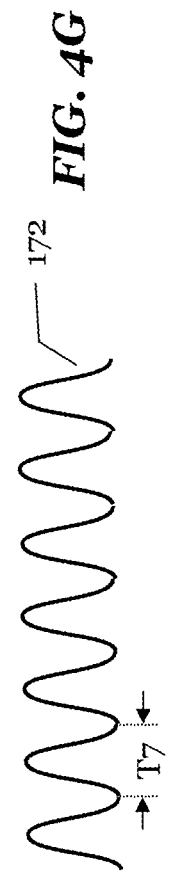

As illustrated in FIGS. 4A-4H, in alternative embodiments, the passivant gas may be introduced as periodic pulses (e.g., square pulses 160 in FIG. 4A, rectangular in FIG. 4E, saw tooth in FIG. 4C, triangular in FIG. 4F, and sinusoidal in FIG. 4G. The time periods for the periodic pulses is illustrated as T1-T7 for FIGS. 4A-4G respectively.

Figure 4H:
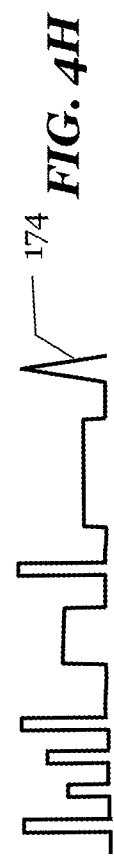

Embodiments of the present disclosure also contemplate non-periodic pulses (e.g., alternating square and rectangular pulses as illustrated in FIG. 4B and mixed shaped pulses in FIG. 4H.) In addition, embodiments of the present disclosure also contemplate pulses with different heights as illustrated in FIG. 4D. Furthermore, in some embodiments, the ON time may be different from the OFF time (pulses 162 in FIG. 4B and pulses 168 in FIG. 4E), e.g., have duty cycles between 10% to 90%.

Additionally, the above illustration represents the operation of a control valve (e.g. as discussed further below in FIG. 5) that regulates the flow of passivant gas into the chamber (and the actual flow rate, which would be different due to various pressure and diffusion effects).

Figure 5:
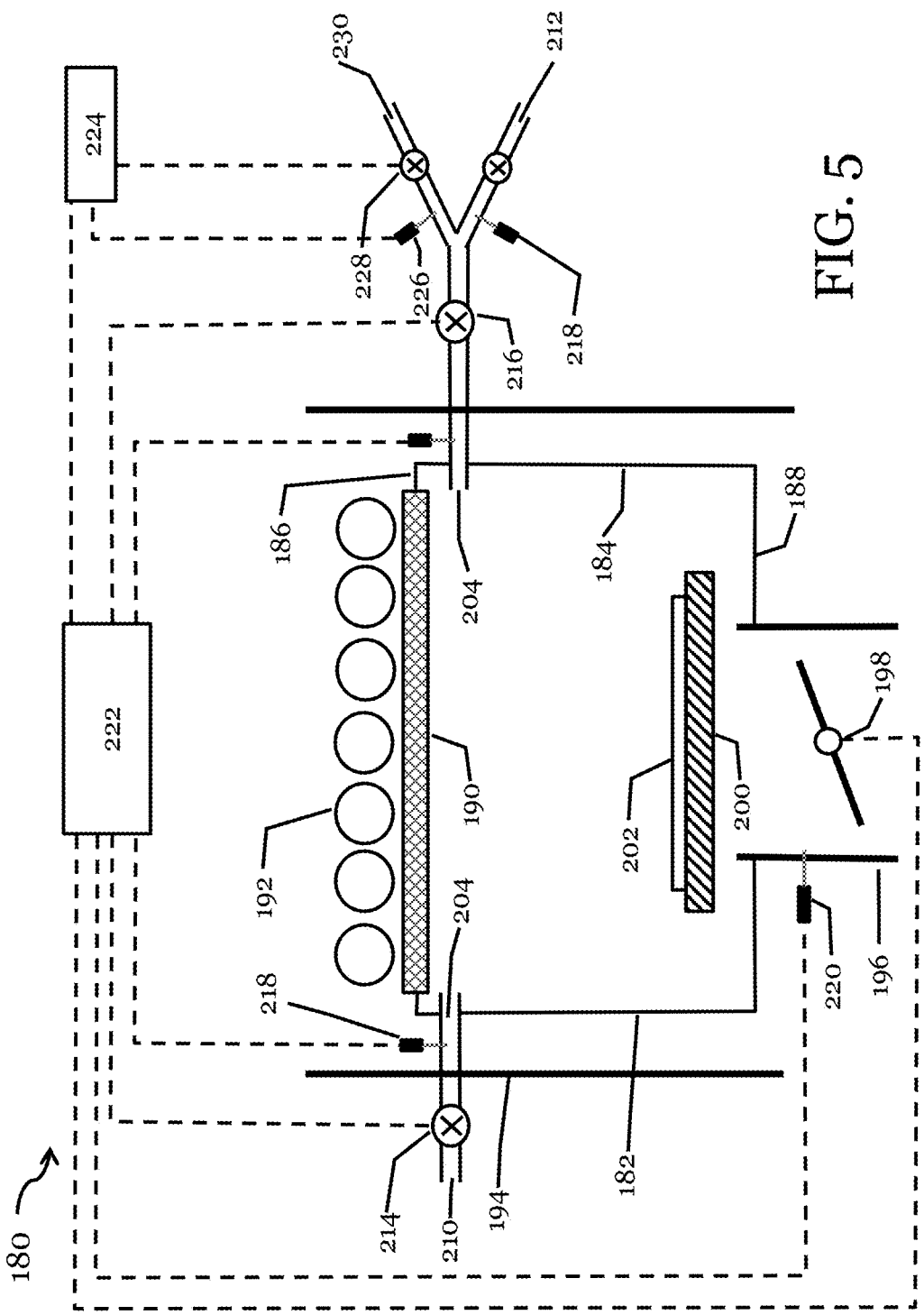
FIG. 5 illustrates a cross-sectional view of a plasma processing apparatus in accordance with an embodiment.

FIG. 5 illustrates a cross-sectional view of a plasma processing apparatus in accordance with an embodiment of the invention.

Referring to FIG. 5, a plasma processing apparatus 180 is used to etch at least a portion of a refractory metal film 106, for example, pure ruthenium, an alloy of ruthenium with other metals, molybdenum, niobium, pure osmium, an alloy of osmium with other metals, pure iridium, and an alloy of iridium with other metals thereof. The plasma processing apparatus 180 includes a plasma processing chamber 182 in which the etching process may be performed.

The plasma processing chamber 182 comprises sidewalls 184, a base 188, and a top cover 186 that collectively substantially enclose a plasma during operation. The sidewalls 184, base 188, and top cover 186 may be made of a conductive material (e.g., stainless steel or aluminum) coated with a film such as yttria (e.g., $Y_xO_y$ or $Y_xO_yF_z$) except for a dielectric window 190 (e.g., a quartz window). In the example illustrated in FIG. 5, the dielectric window 190 may be a circular window spanning a major portion of the top cover 186 of a cylindrical plasma processing chamber 182.

In an example plasma system, a planar coil 192 is disposed outside the plasma processing chamber 182 and adjacent to the dielectric window 190. Other electrical connections may be made to other components, as known to a person skilled in the art. For example, the sidewalls 184, base 188, and top cover 186 may be connected to a reference DC potential (e.g., ground potential). The (electrostatic) substrate holder 200 may be tapped (e.g., to connect to ground, a different DC bias, or an RF bias, or a combination of DC and RF bias). An electric field applied to the substrate holder 200 may be used to accelerate inert gas ions to sputter the refractory metal surface and accelerate the etching rate. The plasma processing chamber 182 and the planar coil 192 may be housed within an enclosure 194, which may be a Faraday cage or a solid enclosure.

A substrate holder 200 is disposed in the plasma processing apparatus 180. In various embodiments, the substrate holder 200 may be a disc-shaped electrostatic holder located near the bottom of the plasma processing chamber 182.

A semiconductor substrate 202 (e.g., a semiconductor wafer) is placed over the substrate holder 200. A refractory metal layer 106, e.g., comprising ruthenium, molybdenum, niobium, or osmium, to be processed inside the plasma processing chamber 182 may be present on the semiconductor substrate 202.

In FIG. 5, plasma source gases such as oxygen, a gas including chlorine, an inert sputtering gas, and a passivant gas are introduced into the plasma processing chamber 182 through gas inlet openings 204 in the sidewalls 184. The gas input system may include multiple source gas inlets, e.g., first gas inlet 210, second gas inlet 212 and third gas inlet 230 that inject various process gases into the plasma processing chamber 182 during the plasma etching. First and second mass flow controller valves 214 and 216 may be mass flow controller valves which turn the process gas flows ON and OFF and also regulate the process gas flow into the plasma processing chamber 182 during the plasma etching.

An opening in the base 188 of the plasma processing chamber 182 is the gas outlet 196. A vacuum system (not shown) comprising exhaust pumps and control valves (e.g., throttle valve 198) may be connected to the gas outlet 196 to maintain a desired gas pressure within the plasma processing chamber 182 during the plasma etching.

A control system comprising a microcontroller 222 coupled to gas flow sensors 218 and first and second mass flow controller valves 214 and 216 on the first and second gas inlets 210 and 212 and also coupled to pressure sensors 220 with feedback control of the throttle valve 198 on the gas outlet 196 maintains pressure in the plasma processing chamber by balancing the gas flow between the gas inlet openings 204 and the gas outlet 196.

A waveform generator 224 may be programmed to produce pulse trains such as are described in FIG. 3A and FIGS.

4A-4H. The waveform generator 224 may be coupled to the microcontroller 222, and coupled to the flow sensor 226 and a third mass flow controller valve 228 on the passivant gas 140 line. Feedback data from the flow sensor 226 to the waveform generator 224 may be used to control the third mass flow controller valve 228 and regulate the flow of the passivant gas 140 as described in FIG. 3A and FIGS. 4A-4H.

An electrical signal from the waveform generator 224 may actuate the third mass flow controller valve 228 to inject either a continuous flow passivant gas 140 or to inject pulses of passivant gas 140 into the plasma processing chamber 182.

The control system may also include plasma sensors (not shown) such as temperature, plasma electron density, a V-I sensor to monitor the voltage and current of the power. The control system may dynamically monitor and control the plasma process, for example, the constituency, temperature, and pressure of the gas mixture in the plasma processing chamber 182 as well as gas flow rates in the gas inlet openings 204 and the gas outlet 196, respectively.

In an arrangement, the plasma processing apparatus 180 is in an Inductively Coupled Plasma (ICP) reactor and the plasma is an inductively coupled plasma. In other embodiments, the plasma processing apparatus 180 may be a capacitively coupled plasma reactor.

FIGS. 6A-6D are cross-sections depicting the major steps in the plasma etching of patterned refractory metal 106 geometries to form refractory metal 106 leads with smooth, vertical sidewalls in accordance with an embodiment. FIG. 7 is a flow diagram describing the cross-sections in accordance with an embodiment.

Figure 6A:
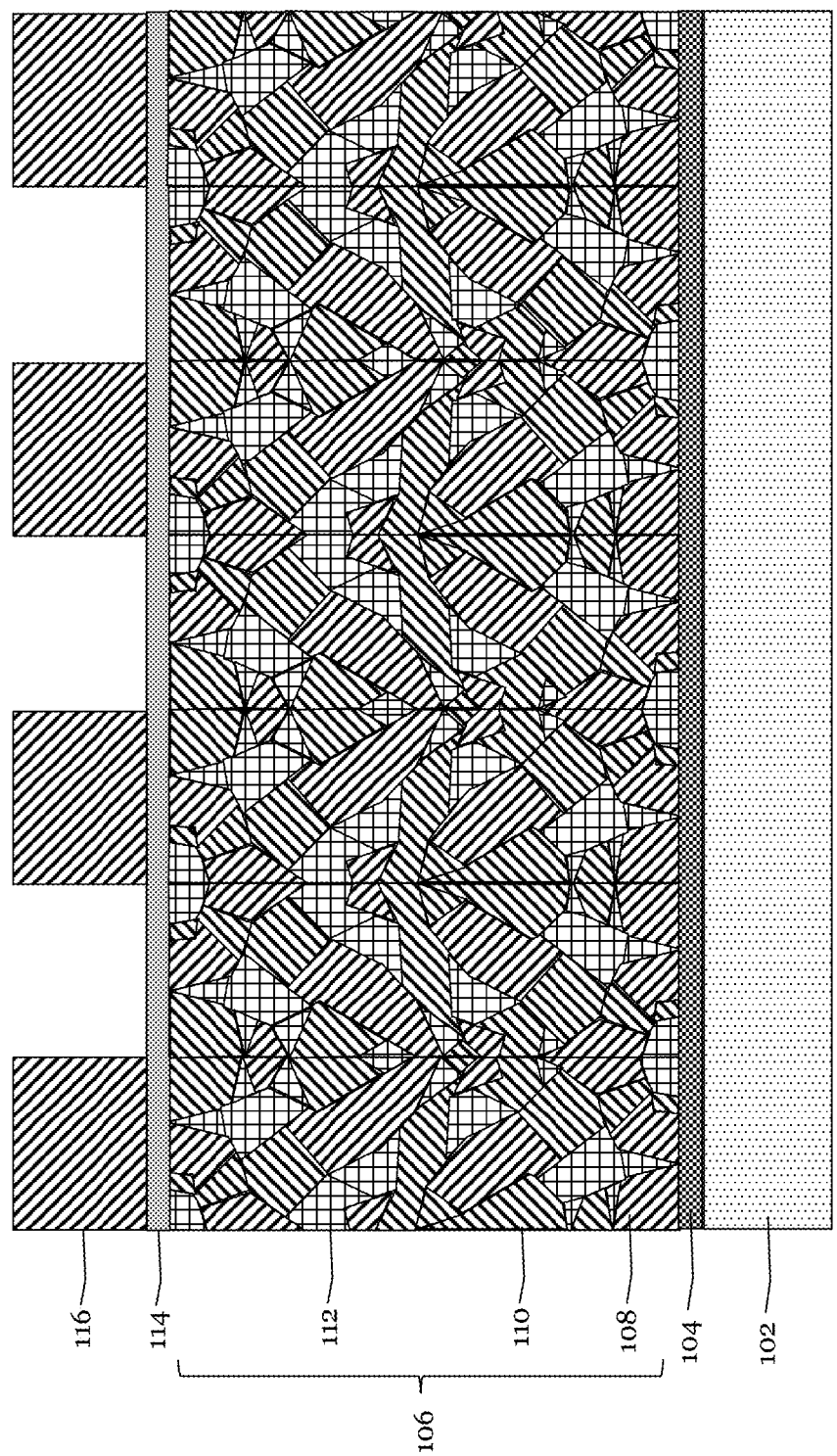
Figure 7:
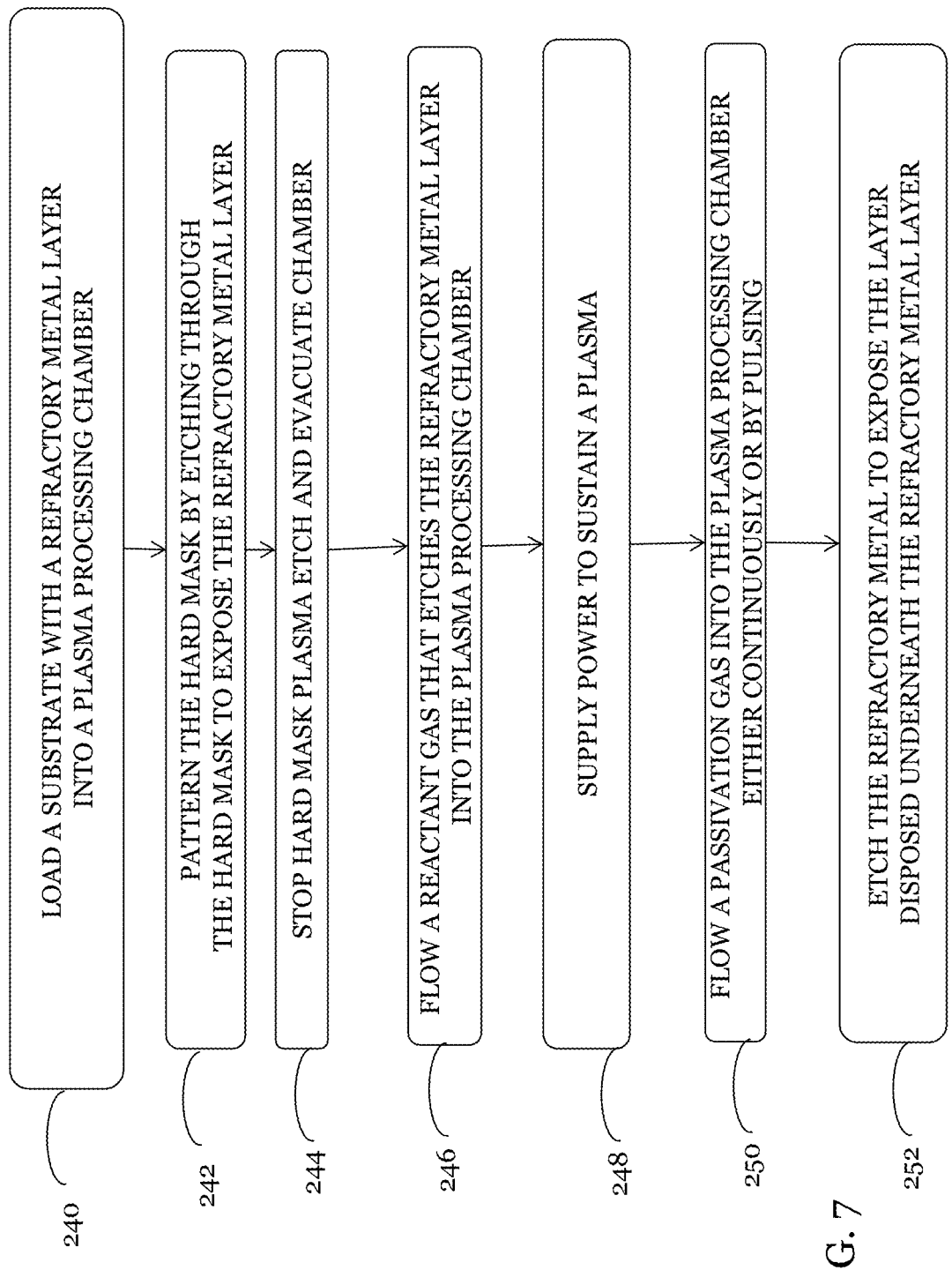
FIG. 7 is a flow diagram of process steps of a method in accordance with an embodiment described in FIGS. 6A-6D.

FIG. 6A illustrates a cross-sectional view of a refractory metal layer 106 with a photo resist pattern 116 on a hard mask 114 layer.

The refractory metal layer 106 may be a refractory metal such as pure ruthenium, an alloy of ruthenium with other metals, molybdenum, niobium, pure osmium, an alloy of osmium with other metals, pure iridium, and an alloy of iridium with other metals thereof.

The hard mask 114 layer may be a dielectric such as silicon dioxide or silicon nitride or may be a metal such as titanium, titanium nitride, tantalum, and tantalum nitride.

The etch stop layer 104 may be a dielectric such as silicon nitride and silicon carbon nitride or can be a metal such as titanium nitride and tantalum nitride. The etch stopping layer 104 can have a high selectivity to the refractory metal plasma etching.

In step 240, FIG. 7 a substrate 102 with the patterned 116 refractory metal layer 106 as described in the cross-section in FIG. 6A is loaded into a plasma processing chamber 182. In various embodiments, the substrate 102 may include active devices formed therein at this stage of processing. The substrate 102 may comprises a semiconductor wafer, and may comprise a silicon wafer, or a silicon-on-insulator wafer. In some embodiments, the substrate 102 may comprise a semiconductor layer grown in a substrate. In some embodiments, the substrate 102 may comprise a layer of compound semiconductor such as GaN, GaAs, InSb, InP, SiC, and others.

Figure 6B:
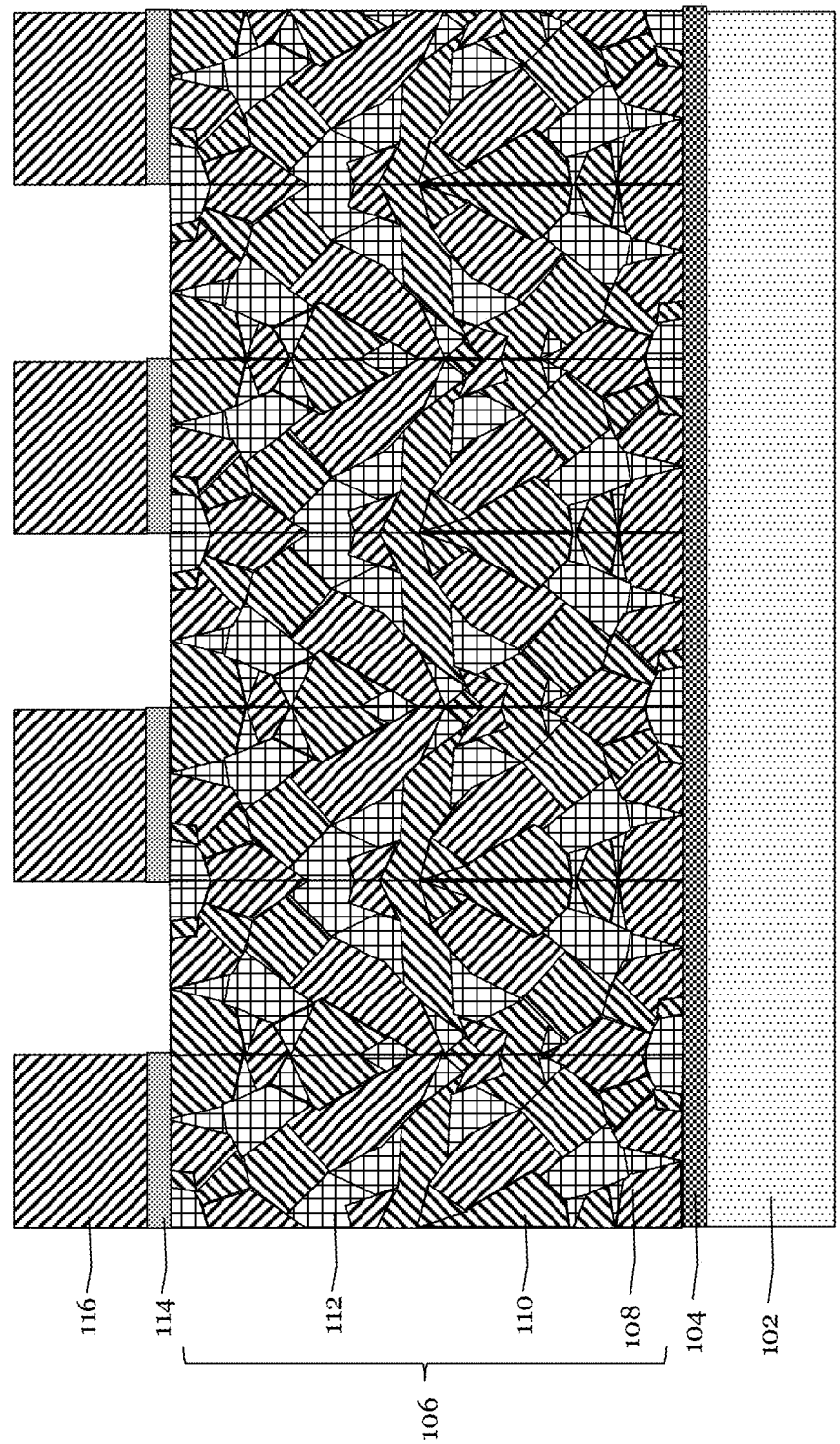

The cross-section in FIG. 6B (step 242, FIG. 7) illustrates a cross-sectional view after the hard mask 114 is patterned by etching through the hard mask 114 layer to expose the refractory metal layer 106 disposed beneath. A hard mask 114 may be used for plasma etching refractory metal 106 because the oxygen plasma rapidly erodes photoresist.

After the hard mask 114 is patterned, the hard mask etching plasma is turned off and the plasma processing chamber is evacuated (step 244, FIG. 7).

In step 246, FIG. 7, the flows of reactant gases for etching the refractory metal layer 106 are then started into the plasma processing chamber 182. The reactant gases may comprise oxygen and a gas including chlorine. The flow of an inert sputtering gas may also be started into the plasma processing chamber 182. The flow of a passivant gas 140 may be started simultaneously with the flow of the reactant gases or may be delayed until after sidewalls begin to form. In various embodiments, the introduction of the gases into the plasma processing chamber 182 may be performed using the processes described in FIG. 2A-2B, or 3A-3B as well as 4A-4H.

After the pressure is stabilized, power is supplied to the plasma processing chamber 182 to strike and sustain the plasma (step 248, FIG. 7).

When the plasma is stable, the flow of the passivation gas 140 is started (step 250, FIG. 7). Alternatively, if flow of the passivant gas 140 was initiated along with the reactant gas flows, this step may be omitted. In various embodiments, the introduction of the passivant gas 140 into the plasma processing chamber 182 may be performed using the processes described in FIG. 2A-2B, or 3A-3B as well as 4A-4H. As discussed previously, the passivation gas 140 may be a gas including sulfur or may be HBr or $SiCl_4$.

In a specific embodiment, the refractory metal layer 106 comprises ruthenium and the plasma processing apparatus 180 discussed above is an inductive coupled plasma (ICP) system. The refractory metal layer 106 comprising ruthenium is etched with an oxygen, chlorine, and argon plasma while intermittently flowing $SO_2$ into an ICP plasma tool. In the specific embodiment, plasma source power is 1000 W to 1500 W, substrate bias is 60 W to 140 W, pressure in the plasma chamber is 40 mTorr to 80 mTorr, substrate temperature is 15° C. to 50° C., argon flow is 250 sccm to 450 sccm, chlorine flow is 30 sccm to 100 sccm, oxygen flow is 1200 sccm to 1500 sccm, and the flow for sulfur dioxide is between 4 sccm and 12 sccm with a ON duration between about 50 msec and 500 msec, and a pulse rate between about 1 pulse per second and one pulse per 5 seconds.

In an example embodiment, the flow rate of sulfur dioxide during the ON period is about 0.5% to 1% the flow rate of the oxygen gas.

Figure 6C:
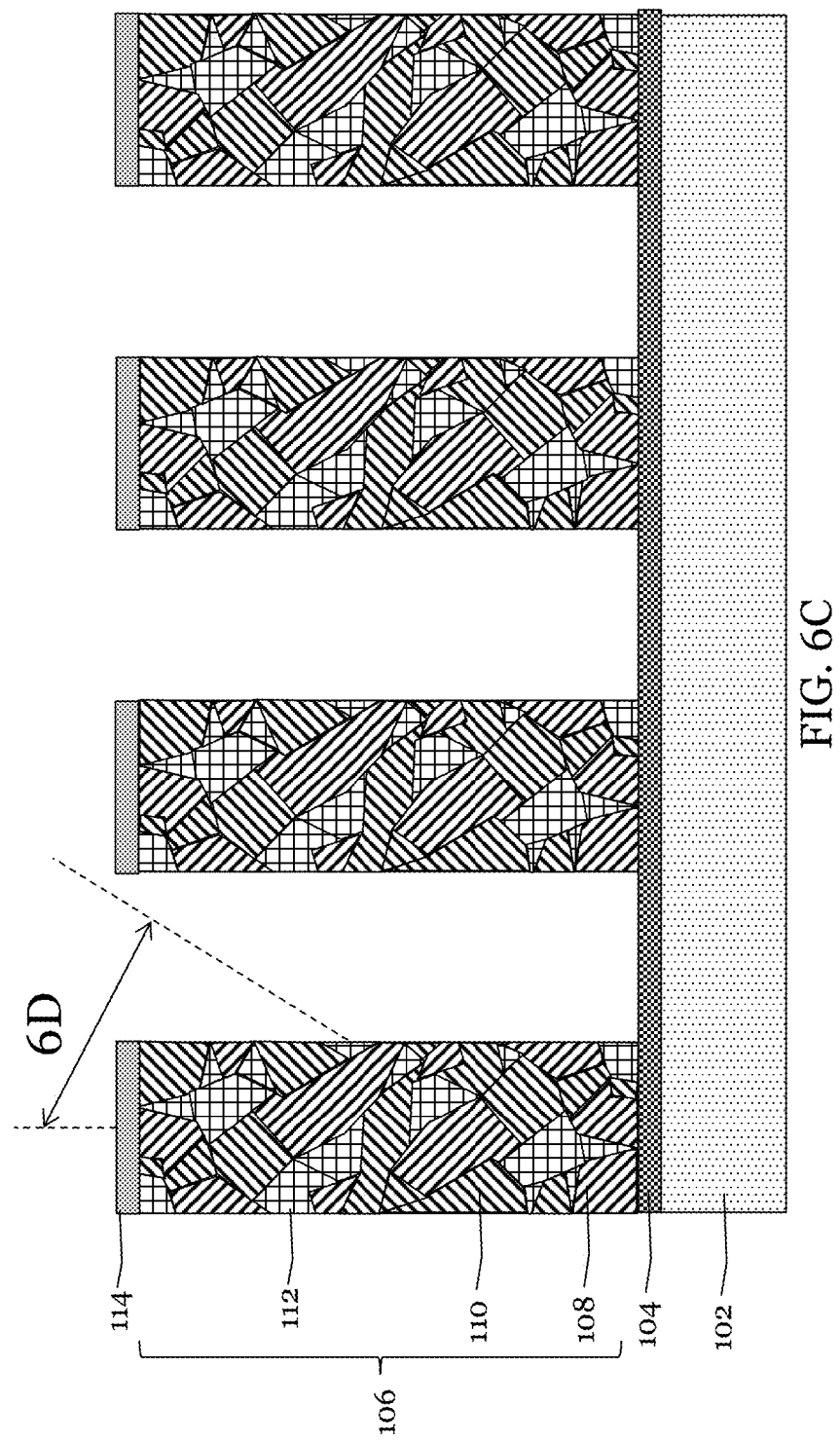

Referring next to step 252, FIG. 7, the refractory metal 106 etching is continued until the underlying etch stopping layer 104 is exposed as is illustrated in the cross-sectional view of FIG. 6C.

The inventors of this disclosure have identified that pulsing the passivant gas provides adequate sidewall passivation with minimal impact on etching time. Passivating the sidewalls while etching prevents the formation of mouse bites and reduces the sidewall surface roughness. FIG. 6D illustrates an expanded cross-sectional view of a refractory metal 106 lead sidewall post etching with a passivant gas. The passivation protects the refractory metal crystal grains, 108, 110, and 112 from lateral etching and protects the grain boundaries 118 between the grains from being attacked and etched laterally. Accordingly, refractory metal 106 leads etched with the addition of a passivant gas during plasma etching may have lower resistance and less lead-to-lead resistance variation than leads etched without a passivant gas.

Figure 8:
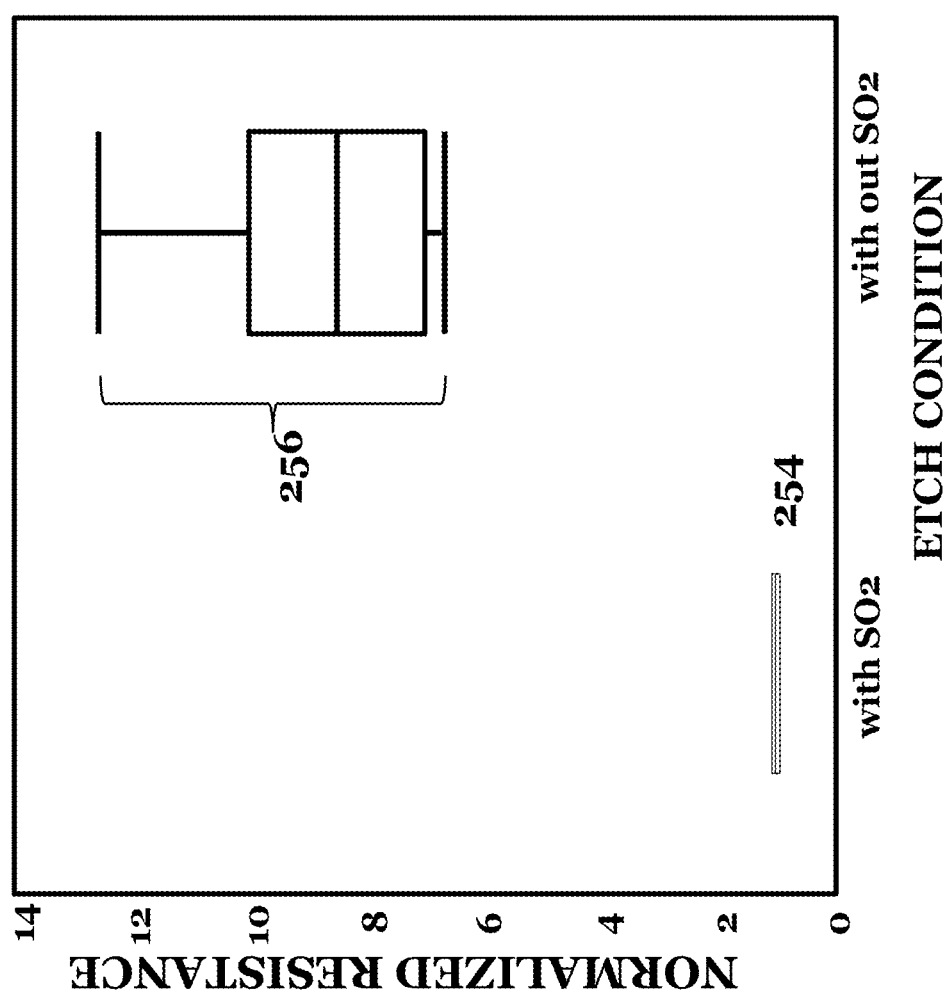
FIG. 8 is the cumulative resistance probability plot of ruthenium leads etched using a passivant gas comprising $SO_2$ in accordance with an embodiment compared with the cumulative resistance probability plot of ruthenium leads etched using the same etch without any passivant gas.

FIG. 8 compares a box plot 254 of normalized resistance of ruthenium leads etched using an embodiment method with pulsed passivation gas comprising $SO_2$ to a box plot 256 of normalized resistance of ruthenium leads etched using the same etching process with no passivation gas. The median of the normalized resistance of ruthenium leads etched using pulsed passivant gas comprising $SO_2$ is 1 whereas the median of the normalized resistance of ruthenium leads etched without SO2 is about 9. In addition, the normalized resistance of ruthenium leads etched without SO2 ranges from 7 to 13 whereas the normalized resistance of ruthenium leads etched with SO2 is tightly distributed around 1. Thus, the inventors of this application have found that the use of passivant gas not only helps to control sidewall profiles by changing the etch rates locally but also improves uniformity across the wafer because of improved control over the etch process. Accordingly, using embodiments of the present invention, within wafer variation may be reduced significantly.

Additional examples are provided below.

Example 1

A method of plasma processing, the method including: etching a refractory metal by flowing oxygen into a plasma processing chamber, intermittently flowing a passivation gas into the plasma processing chamber, and supplying power to sustain a plasma in the plasma processing chamber.

Example 2

The method of example 1, where supplying the power includes supplying the source power at a first frequency and intermittently flowing the passivation gas includes flowing the passivation gas at a second frequency lower than the first frequency.

Example 3

The method of one of examples 1 or 2, where intermittently flowing the passivation gas includes performing a cyclic process when supplying the source power, the cyclic process including the steps of flowing the passivation gas into the plasma processing chamber for a first period of time, and stopping the flowing of the passivation gas into the plasma processing chamber while continuing to supply the source power for a second period of time.

Example 4

The method of one of examples 1 to 3, where the first period of time is less than the second period of time.

Example 5

The method of one of examples 1 to 4, where the refractory metal includes a metal selected from the group consisting of pure ruthenium, an alloy of ruthenium with other metals, molybdenum, niobium, pure osmium, an alloy of osmium with other metals, pure iridium, and an alloy of iridium with other metals thereof.

Example 6

The method of one of examples 1 to 5, where the refractory metal includes a layer of ruthenium.

Example 7

The method of one of examples 1 to 6, where the passivation gas includes a gas selected from a group consisting of $SO_2$, $SF_6$, SO, COS, $H_2S$, HBr, and $SiCl_4$.

Example 8

The method of one of examples 1 to 7, further including flowing an inert gas and a gas including chlorine into the plasma processing chamber while flowing the oxygen.

Example 9

The method of one of examples 1 to 8, where the gas including chlorine comprises a gas selected from a group consisting of $Cl_2$, $CCl_4$, $CHCl_3$, and HCl.

Example 10

The method of one of examples 1 to 9, where the inert gas comprises a noble gas selected from a group consisting of helium, argon, xenon, and krypton.

Example 11

A method of plasma processing, the method including: patterning a hard mask layer disposed over a refractory metal layer; and in a plasma processing chamber, patterning the refractory metal layer using the hard mask layer as an etch mask, the patterning of the refractory metal layer including: flowing reactant gas for etching the refractory metal layer into the plasma processing chamber, pulsing a passivation gas into the plasma processing chamber, and etching the refractory metal layer to expose an underlying layer disposed underneath the refractory metal layer.

Example 12

The method of example 11, where pulsing the passivation gas includes performing a cyclic process when supplying power to generate a plasma within the plasma processing chamber, the cyclic process including the steps of flowing the passivation gas into the plasma processing chamber for a first period of time, and stopping the flowing of the passivation gas into the plasma processing chamber while continuing to supply the power for a second period of time.

Example 13

The method of one of examples 11 or 12, where the first period of time is less than the second period of time.

Example 14

The method of one of examples 11 to 13, where the refractory metal layer includes ruthenium.

Example 15

The method of one of examples 11 to 14, further including flowing a gas including chlorine along with the reactant gas, wherein the reactant gas comprises oxygen, and wherein the gas including chlorine is selected from a group consisting essentially of $Cl_2$, $CCl_4$, $CHCl_3$, and HCl.

Example 16

The method of one of examples 11 to 15, wherein the refractory metal layer includes a metal selected from the group consisting essentially of pure ruthenium, an alloy of ruthenium with other metals, molybdenum, niobium, pure osmium, an alloy of osmium with other metals, pure iridium, and an alloy of iridium with other metals thereof Example 17

The method of one of examples 11 to 16, where the passivation gas comprises HBr, $SiCl_4$, or comprises a gas including sulfur selected from a group consisting essentially of $SO_2$, SO, COS, and $H_2S$.

Example 18

A method of plasma processing, the method including: plasma etching a layer including ruthenium or molybdenum by sustaining a plasma in a plasma processing chamber, during the plasma etching, continuously flowing oxygen and a gas including chlorine into the plasma processing chamber, and during the plasma etching, flowing a passivation gas including sulfur into the plasma processing chamber.

Example 19

The method of example 18, where the passivation gas includes $SO_2$.

Example 20

The method of one of examples 18 or 19, where the gas including chlorine comprises a gas selected from a group consisting of $Cl_2$, $CCl_4$, $CHCl_3$, and HCl.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing, the method comprising:
    loading a substrate comprising a layer of a refractory metal into a plasma processing chamber, the layer of the refractory metal comprising crystals of the refractory metal with different orientations;
    etching through the crystals of the layer of the refractory metal to form a recess with sidewalls, the etching comprising:
        flowing oxygen at a first flow rate into the plasma processing chamber;
        supplying power to sustain a plasma comprising the oxygen in the plasma processing chamber; and
        while flowing the oxygen at the first flow rate, intermittently flowing a passivation gas comprising sulfur into the plasma processing chamber, the passivation gas comprising sulfur controlling the profile of the sidewalls by locally changing etch rates of the crystals in the layer of the refractory metal being etched.

2. The method of claim 1, wherein supplying the power comprises supplying the power at a first frequency and intermittently flowing the passivation gas comprises flowing the passivation gas at a second frequency lower than the first frequency.

3. The method of claim 1, wherein intermittently flowing the passivation gas comprises performing a cyclic process when supplying the power, the cyclic process comprising the steps of:
    flowing the passivation gas into the plasma processing chamber for a first period of time; and
    stopping the flowing of the passivation gas into the plasma processing chamber when supplying the power for a second period of time that is longer than the first period of time.

4. The method of claim 1, wherein the refractory metal comprises a metal selected from the group consisting of ruthenium, osmium, iridium, molybdenum, and niobium.

5. The method of claim 1, wherein the refractory metal comprises a layer of ruthenium, and wherein the passivation gas comprises SO2.

6. The method of claim 1, wherein the passivation gas comprises a gas selected from a group consisting of SO2, SF6, SO, COS, and H2S.

7. The method of claim 1, further comprising flowing an inert gas and a gas including chlorine into the plasma processing chamber while flowing the oxygen.

8. The method of claim 7, wherein the gas including chlorine comprises a gas selected from a group consisting of Cl2, CCl4, CHCl3, and HCl.

9. The method of claim 7, wherein the inert gas comprises a noble gas selected from a group consisting of helium, argon, xenon, and krypton.

10. The method of claim 1, further comprising:
    patterning a hard mask layer disposed over the layer of the refractory metal; and
    the etching comprises patterning the layer of the refractory metal using the hard mask layer as an etch mask.

11. The method of claim 1, wherein the refractory metal comprises a metal selected from the group consisting of a pure ruthenium, an alloy of ruthenium with other metals, molybdenum, niobium, pure osmium, an alloy of osmium with other metals, pure iridium, and an alloy of iridium with other metals thereof.

12. A method of plasma processing, the method comprising:
    plasma etching a layer comprising ruthenium or molybdenum by continuously flowing a gas including chlorine into a plasma processing chamber;
    sustaining a plasma in a plasma processing chamber; and
    during the plasma etching, flowing a passivation gas including sulfur into the plasma processing chamber, wherein the flowing of the passivation gas comprises turning on and off the passivation gas over a first time period, and wherein the gas including chlorine is continuously flowed into the plasma processing chamber during the first time period.

13. The method of claim 12, wherein the passivation gas comprises SO2.

14. The method of claim 12, wherein the gas including chlorine comprises a gas selected from a group consisting of Cl2, CCl4, CHCl3, and HCl.

15. The method of claim 12, wherein a flow rate of the passivation gas is about 0.5% to 1% of a flow rate of the gas including chlorine.

16. The method of claim 12, wherein the layer comprising ruthenium or molybdenum is a molybdenum layer, wherein the gas including chlorine comprises a gas selected from a group consisting of Cl2, CCl4, CHCl3, and HCl, and wherein the passivation gas comprises SO2.

17. A method comprising:
providing a plurality of substrates, each substrate comprising a layer of a refractory metal, the layer of the refractory metal comprising crystals of the refractory metal with different orientations;
loading each of the substrates into a plasma processing chamber;
for each of the substrates, forming a metal feature by etching through the crystals of the layer of the refractory metal, the etching comprising
flowing oxygen at a first flow rate into the plasma processing chamber,
supplying power to sustain a plasma comprising the oxygen in the plasma processing chamber, and
while flowing the oxygen at the first flow rate, intermittently flowing a passivation gas into the plasma processing chamber, wherein a flow rate of the passivation gas is different between each of the substrates;
measuring a resistance of the metal feature in each of the substrates; and
determining a second flow rate of the passivation gas based on the measured resistance of the metal feature in each of the substrates; and
etching a plurality of wafers by
flowing oxygen at the first flow rate into the plasma processing chamber,
supplying power to sustain a plasma comprising the oxygen in the plasma processing chamber, and
while flowing the oxygen at the first flow rate, intermittently flowing the passivation gas at the second flow rate into the plasma processing chamber.

18. The method of claim 17, wherein the refractory metal is ruthenium and the passivation gas is SO2.

19. The method of claim 17, wherein the passivation gas comprises a gas selected from a group consisting of SO2, SF6, SO, COS, H2S, HBr, and SiCl4.

20. The method of claim 17, further comprising flowing an inert gas and a gas including chlorine into the plasma processing chamber while flowing the oxygen, wherein the gas including chlorine comprises a gas selected from a group consisting of Cl2, CCl4, CHCl3, and HCl, and wherein the inert gas comprises a noble gas selected from a group consisting of helium, argon, xenon, and krypton.

* * * * *